(12) United States Patent
Kim et al.

(10) Patent No.: US 11,189,625 B2
(45) Date of Patent: Nov. 30, 2021

(54) SEMICONDUCTOR MEMORY DEVICE HAVING CELL SOURCE STRUCTURE AND MANUFACTURING METHOD THEREOF

(71) Applicant: SK hynix Inc., Icheon-si (KR)

(72) Inventors: Jae Taek Kim, Icheon-si (KR); Hye Yeong Jung, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 0 days.

(21) Appl. No.: 16/936,203

(22) Filed: Jul. 22, 2020

(65) Prior Publication Data

US 2021/0242224 A1     Aug. 5, 2021

(30) Foreign Application Priority Data

Jan. 31, 2020  (KR) .......................... 10-2020-0011978

(51) Int. Cl.
*H01L 27/112*     (2006.01)
*H01L 27/24*      (2006.01)
*H01L 27/11556*   (2017.01)
*H01L 27/11582*   (2017.01)

(52) U.S. Cl.
CPC .. *H01L 27/11286* (2013.01); *H01L 27/11556* (2013.01); *H01L 27/11582* (2013.01); *H01L 27/2454* (2013.01)

(58) Field of Classification Search
CPC .......... H01L 27/1128; H01L 27/11286; H01L 27/11556; H01L 27/11578; H01L 27/11582; H01L 27/2454
USPC ................................................ 257/278, 314
See application file for complete search history.

(56) References Cited

U.S. PATENT DOCUMENTS

| | | | | |
|---|---|---|---|---|
| 2016/0049423 | A1* | 2/2016 | Yoo | H01L 27/1157 257/324 |
| 2016/0225714 | A1* | 8/2016 | Yun | H01L 27/11582 |
| 2018/0358408 | A1* | 12/2018 | Lee | G11C 11/1659 |
| 2019/0237472 | A1* | 8/2019 | Oh | H01L 27/11573 |
| 2020/0066742 | A1* | 2/2020 | Kim | H01L 27/11582 |
| 2021/0104543 | A1* | 4/2021 | Xiao | H01L 27/11582 |

FOREIGN PATENT DOCUMENTS

| | | | |
|---|---|---|---|
| KR | 1020190052301 A | | 5/2019 |
| KR | 101985936 B1 | | 6/2019 |

* cited by examiner

*Primary Examiner* — Matthew E Warren
(74) *Attorney, Agent, or Firm* — William Park & Associates Ltd.

(57) ABSTRACT

There are provided a semiconductor memory device and a manufacturing method thereof. The semiconductor memory device includes: a cell source structure; a first stack structure disposed on the cell source structure; a channel structure penetrating the first stack structure, the channel structure being connected to the cell source structure; and a first peripheral transistor including impurity regions. A level of a bottom surface of each of the impurity regions is higher than that of a bottom surface of the cell source structure, and a level of a top surface of each of the impurity regions is lower than that of a top surface of the cell source structure.

18 Claims, 14 Drawing Sheets

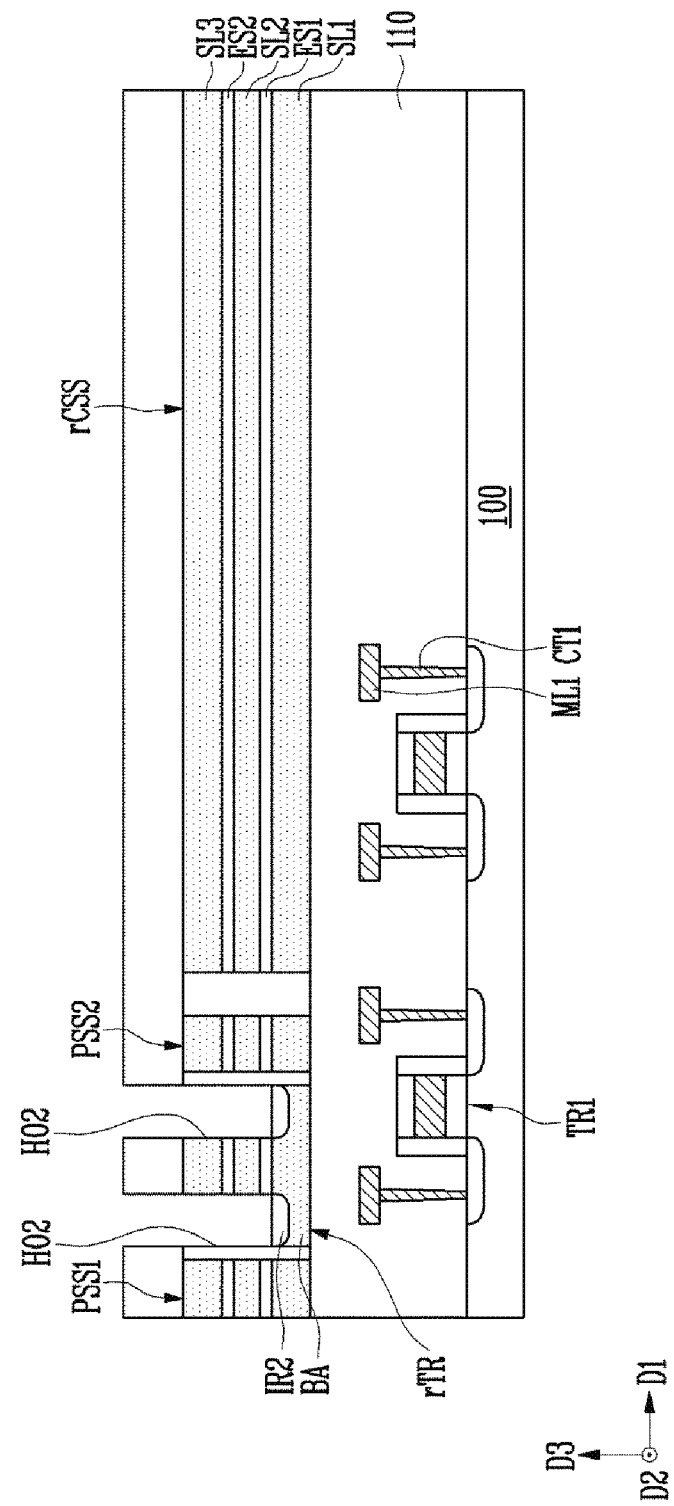

SEMICONDUCTOR MEMORY DEVICE HAVING CELL SOURCE STRUCTURE AND MANUFACTURING METHOD THEREOF

CROSS-REFERENCE TO RELATED APPLICATION

The present application claims priority under 35 U.S.C. § 119(a) to Korean patent application number 10-2020-0011978, filed on Jan. 31, 2020, in the Korean Intellectual Property Office, the entire disclosure of which is incorporated herein by reference.

BACKGROUND

1. Technical Field

The present disclosure generally relates to a semiconductor memory device and a manufacturing method thereof, and more particularly, to a three-dimensional semiconductor memory device and a manufacturing method thereof.

2. Related Art

A semiconductor memory device includes memory cells capable of storing data.

According to a method of storing data and a method of retaining data, the semiconductor memory device may be classified into a volatile semiconductor memory device and a nonvolatile semiconductor memory device. The volatile semiconductor memory device is a memory device in which stored data disappears when the supply of power is interrupted, and the nonvolatile semiconductor memory device is a memory device in which stored data is retained even when the supply of power is interrupted.

Recently, as portable electronic devices are increasingly used, nonvolatile semiconductor memory devices have been increasingly used, and the high integration and large capacity of semiconductor memory devices have been required to achieve portability and large capacity. In order to achieve the portability and large capacity, there have been proposed three-dimensional semiconductor memory devices.

SUMMARY

In accordance with an aspect of the present disclosure, there is provided a semiconductor memory device which may include: a cell source structure; a first stack structure disposed on the cell source structure, the first stack structure including insulating patterns and conductive patterns, which are alternately stacked; a channel structure penetrating the first stack structure, the channel structure being connected to the cell source structure; and a first peripheral transistor including impurity regions, wherein a level of a bottom surface of each of the impurity regions is higher than that of a bottom surface of the cell source structure, and a level of a top surface of each of the impurity regions is lower than that of a top surface of the cell source structure.

In accordance with another aspect of the present disclosure, there is provided a semiconductor memory device which may include: a first peripheral transistor; a first insulating layer covering the first peripheral transistor; a cell source structure on the first insulating layer; a first stack structure disposed on the cell source structure, the first stack structure including first insulating patterns and conductive patterns, which are alternately stacked; a channel structure penetrating the first stack structure, the channel structure being connected to the cell source structure; and a second peripheral transistor on the first insulating layer, wherein the first peripheral transistor is disposed at a level lower than that of the cell source structure, and the second peripheral transistor is disposed at the same level as the cell source structure.

In accordance with still another aspect of the present disclosure, there is provided a method of manufacturing a semiconductor memory device, the method may include: forming a preliminary source structure; forming a preliminary transistor and a preliminary cell source structure by patterning the preliminary source structure; forming an impurity region by doping an impurity into the preliminary transistor; and forming a first stack structure and a channel structure on the preliminary cell source structure.

BRIEF DESCRIPTION OF THE DRAWINGS

Examples of embodiments will now be described hereinafter with reference to the accompanying drawings; however, they may be embodied in different forms and should not be construed as limited to the embodiments set forth herein. Rather, these embodiments are provided so that this disclosure will be thorough and complete, and will convey the scope of the examples of embodiments to those skilled in the art.

In the drawing figures, dimensions may be exaggerated for clarity of illustration. It will be understood that when an element is referred to as being "between" two elements, it can be the only element between the two elements, or one or more intervening elements may also be present. Like reference numerals refer to like elements throughout.

FIGS. 2A, 2B, 2C, 2D, 2E, 2F, 2G, 2H, 2I, 2J, and 2K are sectional views illustrating a manufacturing method of the semiconductor memory device in accordance with an embodiment of the present disclosure.

DETAILED DESCRIPTION

The specific structural or functional description disclosed herein is merely illustrative for the purpose of describing embodiments according to the concept of the present disclosure. The embodiments according to the concept of the present disclosure can be implemented in various forms, and cannot be construed as limited to the embodiments set forth herein.

In the description of the present disclosure, the terms "first" and "second" may be used to describe various components, but the components are not limited by the terms. The terms may be used to distinguish one component from another component. For example, a first component may be called a second component and a second component may be called a first component without departing from the scope of the present disclosure.

Embodiments provide a semiconductor memory device capable of improving operational reliability and a manufacturing method of the semiconductor memory device.

Figure 1A:
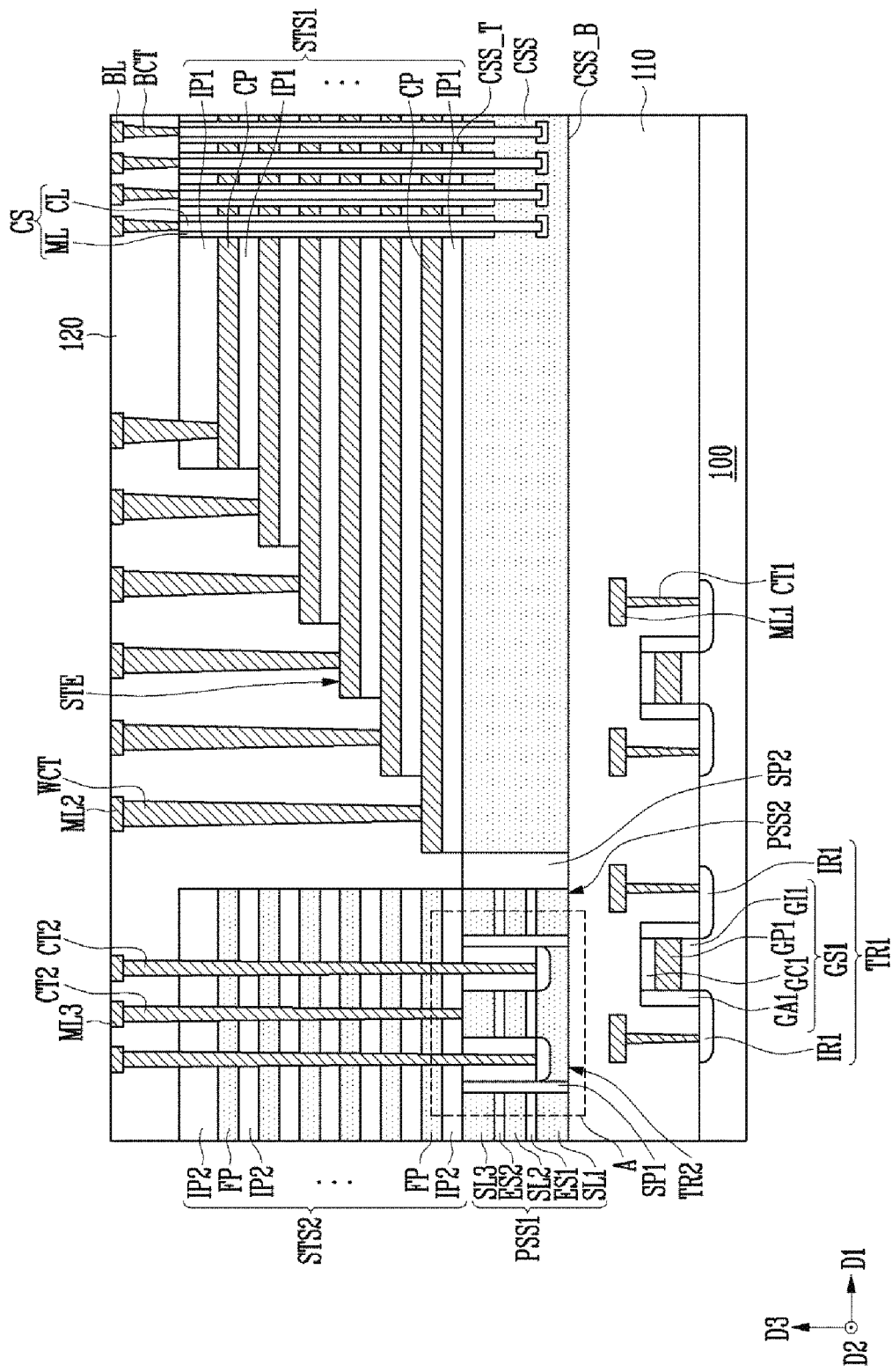
FIG. 1A is a sectional view of a semiconductor memory device in accordance with an embodiment of the present disclosure.
Figure 1B:
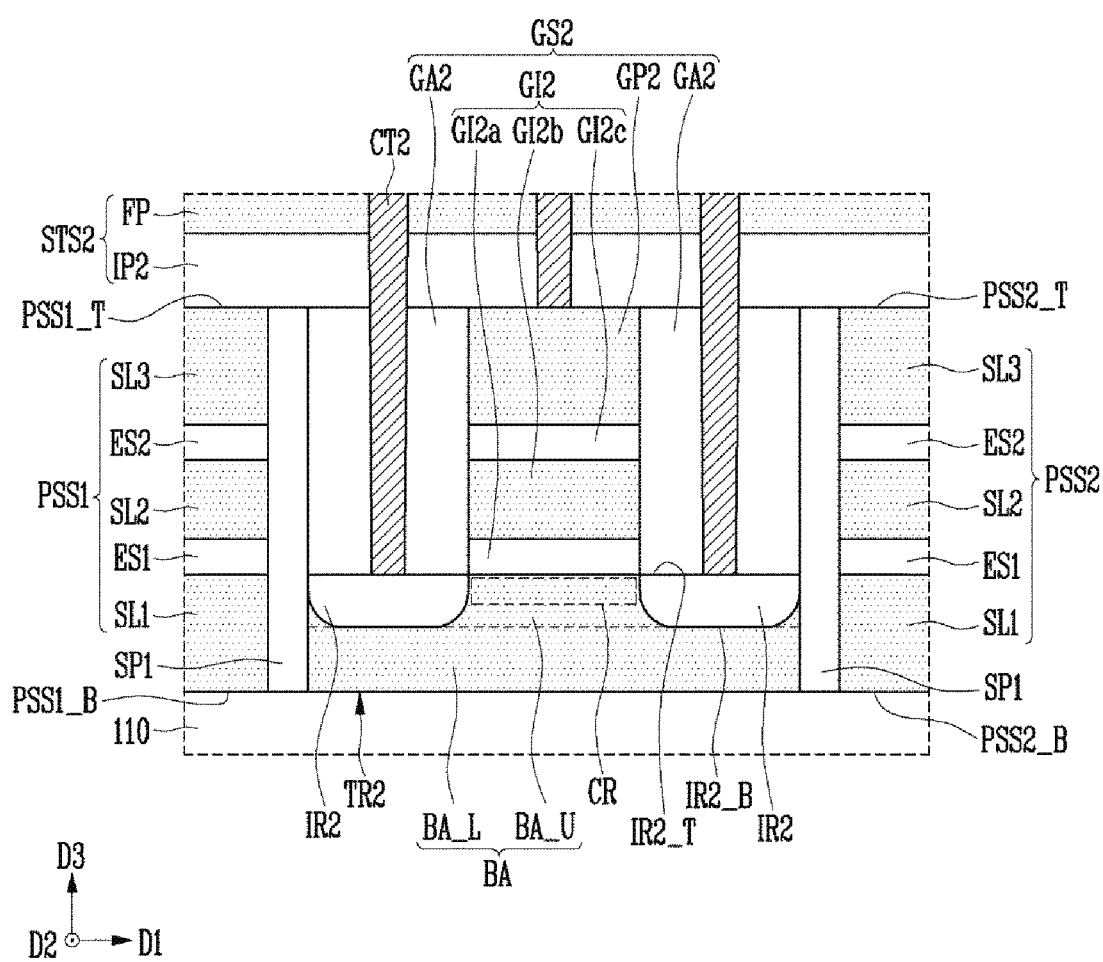
FIG. 1B is an enlarged view of region A shown in FIG. 1A.

FIG. 1A is a sectional view of a semiconductor memory device in accordance with an embodiment of the present disclosure. FIG. 1B is an enlarged view of region A shown in FIG. 1A.

Referring to FIGS. 1A and 1B, the semiconductor memory device in accordance with an embodiment may include a substrate 100. The substrate 100 may have the shape of a plate expanding along a plane defined by a first direction D1 and a second direction D2. The first direction D1 and the second direction D2 may intersect each other. In an example, the direction D1 and the second direction D2 may be perpendicular to each other. The substrate 100 may be a semiconductor substrate. For example, the substrate 100 may be a bulk silicon substrate, a silicon on insulator substrate, a germanium substrate, a germanium on insulator substrate, a silicon-germanium substrate, or an epitaxial thin film formed through a selective epitaxial growth process.

A first insulating layer 110 may be provided on the substrate 100. The first insulating layer 110 may have the shape of a plate expanding along a plane defined by the first direction D1 and the second direction D2. The first insulating layer 110 may include an insulating material. In an example, the first insulating layer 110 may include oxide or nitride.

First peripheral transistors TR1 may be provided on the substrate 100. The first peripheral transistors TR1 may be provided between the substrate 100 and the first insulating layer 110. The first peripheral transistor TR1 may be covered by the first insulating layer 110. Each of the first peripheral transistors TR1 may include first impurity regions IR1 and a first gate structure GS1. The first impurity regions IR1 may correspond to a portion of the substrate 100. The first impurity regions IR1 may be formed by doping an impurity into the substrate 100. The first gate structure GS1 may be disposed between the first impurity regions IR1.

The first gate structure GS1 may include a first gate pattern GP1, a gate insulating layer GI1, a first gate capping layer GC1, and first gate spacers GA1. The gate insulating layer GI1 may be disposed between the first gate pattern GP1 and the substrate 100. The first gate pattern GP1 may be electrically isolated from the substrate 100 by the gate insulating layer GI1. A top surface of the first gate pattern GP1 may be covered by the first gate capping layer GC1. The first gate spacers GA1 may be disposed at both sides of the gate insulating layer GI1, the first gate capping layer GC1, and the first gate pattern GP1. The gate insulating layer GI1, the first gate capping layer GC1, and the first gate pattern GP1 may be disposed between the first gate spacers GA1.

The first gate pattern GP1 may include a conductive material. In an example, the first gate pattern GP1 may include a metal or a conductive semiconductor material. The first gate spacers GA1, the gate insulating layer GI1, and the first gate capping layer GC1 may include an insulating material. In an example, the first gate spacers GA1, the gate insulating layer GI1, and the first gate capping layer GC1 may include oxide. A channel may be formed between the first impurity regions IR1 according to an operation of the first peripheral transistor TR1. The first peripheral transistor TR1 may be an NMOS transistor or a PMOS transistor.

Although not shown in the drawings, a resistor and a capacitor may be further provided in the first insulating layer 110. The first peripheral transistors TR1, the resistor, and the capacitor may be used as elements of a peripheral circuit including a row decoder, a column decoder, a page buffer circuit, and an input/output circuit.

First contacts CT1 and first lines ML1 may be provided in the first insulating layer 110. The first contacts CT1 may be connected to the first peripheral transistors TR1. The first contacts CT1 may be connected to the first impurity regions IR1, respectively. The first lines ML1 may be connected to the first contacts CT1. The first contacts CT1 and the first lines ML1 may include a conductive material. In an example, the first contacts CT1 and the first lines ML1 may include copper, tungsten or aluminum.

A cell source structure CSS may be provided on the first insulating layer 110. The cell source structure CSS may have the shape of a plate expanding along a plane defined by the first direction D1 and the second direction D2. The cell source structure CSS may be used as a source line connected to a memory cell.

The cell source structure CSS may include a conductive material. In an example, the cell source structure CSS may include doped poly-silicon. The cell source structure CSS may be a single layer or a multi-layer.

A first peripheral source structure PSS1, a second peripheral source structure PSS2, and a second peripheral transistor TR2 may be provided on the first insulating layer 110. The first peripheral source structure PSS1, the second peripheral source structure PSS2, and the second peripheral transistor TR2 may be disposed on the same plane as the cell source structure CSS. The first peripheral source structure PSS1, the second peripheral source structure PSS2, and the second peripheral transistor TR2 may be disposed at the same level as the cell source structure CSS. The second peripheral source structure PSS2 may have the same configuration as the first peripheral source structure PSS1. The second peripheral transistor TR2 may overlap with at least one of the first peripheral transistors TR1 in a third direction D3. The third direction D3 may intersect the first direction D1 and the second direction D2. In an example, the third direction D3 may be perpendicular to the first direction D1 and the second direction D2. The second peripheral transistor TR2 may be disposed at a level higher than that of the first peripheral transistors TR1. The first peripheral transistor TR1 may be disposed at a level lower than that of the cell source structure CSS.

The second peripheral transistor TR2 may be provided between the first and second peripheral source structures PSS1 and PSS2. The first and second peripheral source structures PSS1 and PSS2 may be spaced apart from each other in the first direction D1 with the second peripheral transistor TR2 interposed therebetween. The second peripheral source structure PSS2 may be provided between the second peripheral transistor TR2 and the cell source structure CSS. The second peripheral transistor TR2 and the cell source structure CSS may be spaced apart from each other in the first direction D1 with the second peripheral source structure PSS2 interposed therebetween.

First spacers SP1 and a second spacer SP2 may be provided on the first insulating layer 110. The first spacer SP1 may be disposed each of between the first peripheral source structure PSS1 and the second peripheral transistor TR2 and between the second peripheral source structure PSS2 and the second peripheral transistor TR2. The first and second peripheral source structures PSS1 and PSS2 and the second peripheral transistor TR2 may be electrically isolated from each other by the first spacers SP1. The second spacer SP2 may be disposed between the second peripheral source structure PSS2 and the cell source structure CSS. The second peripheral source structure PSS2 and the cell source structure CSS may be electrically isolated from each other by the second spacer SP2. The first and second spacers SP1 and SP2 may include an insulating material. In an example, the first and second spacers SP1 and SP2 may include oxide.

Each of the first and second peripheral source structures PSS1 and PSS2 may include a first source layer SL1, a first etch stop layer ES1, a second source layer SL2, a second etch stop layer ES2, and a third source layer SL3, which are sequentially stacked in the third direction D3. The first etch stop layer ES1 may be provided between the first and second source layers SL1 and SL2. The second etch stop layer ES2 may be provided between the second and third source layers SL2 and SL3. The second source layer SL2 may be provided between the first and third source layers SL1 and SL3.

The first spacer SP1 may be in contact with the first source layer SL1, the first etch stop layer ES1, the second source layer SL2, the second etch stop layer ES2, and the third source layer SL3 of the first peripheral source structure PSS1. The first spacer SP1 and the second spacer SP2 may be in contact with the first source layer SL1, the first etch stop layer ES1, the second source layer SL2, the second etch stop layer ES2, and the third source layer SL3 of the second peripheral source structure PSS2.

The first source layer SL1 may include a conductive material. In an example, the first source layer may include doped poly-silicon. The second source layer SL2 may include a conductive material or an insulating material. In an example, the second source layer SL2 may include doped poly-silicon or undoped poly-silicon. The third source layer SL3 may include a conductive material. In an example, the third source layer SL3 may include doped poly-silicon. The first and second etch stop layers ES1 and ES2 may include an insulating material. In an example, the first and second etch stop layers ES1 and ES2 may include oxide or a high dielectric constant (high-k) material. In an example, the high dielectric constant material may be $Al_2O_3$.

The second peripheral transistor TR2 may include a base part BA, second impurity regions IR2, and a second gate structure GS2. The base part BA, the second impurity regions IR2, and the second gate structure GS2 may be disposed between the first spacers SP1.

The base part BA may be provided on the first insulating layer 110. The base part BA may be disposed at the same level as the first source layers SL1 of the first and second peripheral source structures PSS1 and PSS2. A maximum length of the base part BA in the third direction D3 may be equal to a length of the first source layers SL1 of the first and second peripheral source structures PSS1 and PSS2 in the third direction D3. A maximum thickness of the base part BA may be equal to a thickness of the first source layers SL1 of the first and second peripheral source structures PSS1 and PSS2. The base part BA, the first source layers SL1 of the first and second peripheral source structures PSS1 and PSS2, and the cell source structure CSS may include the same material. The base part BA may include a conductive material. In an example, the base part BA may include doped poly-silicon.

The base part BA may include a lower portion BA_L and an upper portion BA_U. The second impurity regions IR2 may be provided in the upper portion BA_U of the base part BA. The second impurity regions IR2 may be provided at both sides of the upper portion BA_U of the base part BA. The second impurity regions IR2 may be spaced apart from each other in the first direction D1. A portion of the base part BA, which is located at a level lower than that of the second impurity regions IR2, may be defined as the lower portion BA_L of the base part BA. A portion of the base part BA, which is located at the same level as the second impurity regions IR2, may be defined as the upper portion BA_U of the base part BA. The base part BA may include a channel region CR. A portion of the base part BA, which is disposed between the second impurity regions IR2, may be defined as the channel region CR. The channel region CR may be formed in the upper portion BA_U of the base part BA. The second impurity regions IR2 may be disposed at both sides of the channel region CR. The second impurity regions IR2 may include a semiconductor material doped with an impurity. A channel may be formed in the channel region CR according to an operation of the second peripheral transistor TR2.

A level of a bottom surface of the base part BA, a level of a bottom surface PSS1_B of the first peripheral source structure PSS1, a level of a bottom surface PSS2_B of the second peripheral source structure PSS2, and a level of a bottom surface CSS_B of the cell source structure CSS may be the same. A level of bottom surfaces IR2_B of the second impurity regions IR2 may be higher than the level of the bottom surface PSS1_B of the first peripheral source structure PSS1, the level of the bottom surface PSS2_B of the second peripheral source structure PSS2, and the level of the bottom surface CSS_B of the cell source structure CSS. A level of top surfaces IR2_T of the second impurity regions IR2 may be lower than a level of a top surface PSS1_T of the first peripheral source structure PSS1, a level of a top surface PSS2_T of the second peripheral source structure PSS2, and a level of a top surface CSS_T of the cell source structure CSS.

The second gate structure GS2 may be disposed on the base part BA and the second impurity regions IR2. The second gate structure GS2 may include second gate spacers GA2, a gate interposition layer GI2, and a second gate pattern GP2.

The gate interposition layer GI2 may be disposed on the channel region CR of the base part BA, and the second gate pattern GP2 may be disposed on the gate interposition layer GI2. The second gate spacers GA2 may be disposed on the second impurity regions IR2. The gate interposition layer GI2 and the second gate pattern GP2 may be disposed between the second gate spacers GA2.

A level of a top surface of the second gate structure GS2, the level of the top surface PSS1_T of the first peripheral source structure PSS1, the level of the top surface PSS2_T of the second peripheral source structure PSS2, and the level of the top surface CSS_T of the cell source structure CSS may be the same. In other words, a level of top surfaces of the second gate spacers GA2, a level of a top surface of the second gate pattern GP2, the level of the top surface PSS1_T of the first peripheral source structure PSS1, the level of the top surface PSS2_T of the second peripheral source structure PSS2, and the level of the top surface CSS_T of the cell source structure CSS may be the same.

The second gate spacers GA2 may include an insulating material. In an example, the second gate spacers GA2 may include oxide.

The second gate pattern GP2 may be disposed at the same level as the third source layers SL3 of the first and second peripheral source structures PSS1 and PSS2. A length of the second gate pattern GP2 in the third direction D3 may be equal to that of the third source layers SL3 of the first and second peripheral source structures PSS1 and PSS2 in the third direction D3. A thickness of the second gate pattern GP2 may be equal to that of the third source layers SL3 of the first and second peripheral source structures PSS1 and PSS2. The second gate pattern GP2, the third source layers SL3 of the first and second peripheral source structures PSS1 and PSS2, and the cell source structure CSS may include the same material. The second gate pattern GP2 may include a conductive material. In an example, the second gate pattern GP2 may include doped poly-silicon.

The gate interposition layer GI2 may include a first interposition part GI2a, a second interposition part GI2b, and a third interposition part GI2c. The first interposition part GI2a, the second interposition part GI2b, and the third interposition part GI2c may be sequentially stacked along the third direction D3. The first interposition part GI2a may be disposed on the channel region CR of the base part BA, the second interposition part GI2b may be disposed on the first interposition part GI2a, the third interposition part GI2c may be disposed on the second interposition part GI2b, and the second gate pattern GP2 may be disposed on the third interposition part GI2c. The second interposition part GI2b may be disposed between the first interposition part GI2a and the third interposition part GI2c. The first and third interposition parts GI2a and GI2c may include the same material. The second interposition part GI2b may include a material different from that of the first and third interposition parts GI2a and GI2c.

The first interposition part GI2a may be disposed at the same level as the first etch stop layers ES1 of the first and second peripheral source structures PSS1 and PSS2. A length of the first interposition part GI2a in the third direction D3 may be equal to that of the first etch stop layers ES1 of the first and second peripheral source structures PSS1 and PSS2 in the third direction D3. A thickness of the first interposition part GI2a may be equal to that of the first etch stop layers ES1 of the first and second peripheral source structures PSS1 and PSS2. The first interposition part GI2a may include the same material as the first etch stop layers ES1 of the first and second peripheral source structures PSS1 and PSS2. The first interposition part GI2a may include an insulating material. In an example, the first interposition part GI2a may include oxide or a high dielectric constant material.

The second interposition part GI2b may be disposed at the same level as the second source layers SL2 of the first and second peripheral source structures PSS1 and PSS2. A length of the second interposition part GI2b in the third direction D3 may be equal to that of the second source layers SL2 of the first and second peripheral source structures PSS1 and PSS2 in the third direction D3. A thickness of the second interposition part GI2b may be equal to that of the second source layers SL2 of the first and second peripheral source structures PSS1 and PSS2. The second interposition part GI2b may include the same material as the second source layers SL2 of the first and second peripheral source structures PSS1 and PSS2. The second interposition part GI2b may include a conductive material or an insulating material. In an example, the second interposition part GI2b may include doped poly-silicon or undoped poly-silicon.

The third interposition part GI2c may be disposed at the same level as the second etch stop layers ES2 of the first and second peripheral source structures PSS1 and PSS2. A length of the third interposition part GI2c in the third direction D3 may be equal to that of the second etch stop layers ES2 of the first and second peripheral source structures PSS1 and PSS2 in the third direction D3. A thickness of the third interposition part GI2c may be equal to that of the second etch stop layers ES2 of the first and second peripheral source structures PSS1 and PSS2. The third interposition part GI2c may include the same material as the second etch stop layers ES2 of the first and second peripheral source structures PSS1 and PSS2. The third interposition part GI2c may include an insulating material. In an example, the third interposition part GI2c may include oxide or a high dielectric constant material.

A first stack structure STS1 may be provided on the cell source structure CSS. The first stack structure STS1 may include first insulating patterns IP1 and conductive patterns CP, which are alternately stacked in the third direction D3.

The first insulating patterns IP1 may include an insulating material. In an example, the first insulating patterns IP1 may include oxide. The conductive patterns CP may include a gate conductive layer. The gate conductive layer may include a conductive material. In an example, the gate conductive layer may include at least one of a doped silicon layer, a metal silicide layer, tungsten, nickel, and cobalt. The gate conductive layer may be used as a word line connected to a memory cell or a select line connected to a select transistor. The conductive pattern CP may further include a gate barrier layer surrounding the gate conductive layer. In an example, the gate barrier layer may include at least one of titanium nitride and tantalum nitride.

The first stack structure STS1 may include a stepped structure STE. The first insulating patterns IP1 and the conductive patterns CP of the first stack structure STS1 may be formed in a step shape, so that the stepped structure STE is formed. When the stepped structure STE is formed, a portion of a top surface of each of the conductive patterns CP of the first stack structure STS1 may be exposed.

Channel structures CS may be provided, which penetrate the first stack structure STS1. The channel structures CS may penetrate the first insulating patterns IP1 and the conductive patterns CP of the first stack structure STS1. The channel structures CS may extend in the third direction D3. The channel structure CS may be connected to the cell source structure CSS.

Each of the channel structures CS may include a channel layer CL penetrating the first stack structure STS1 and a memory layer ML surrounding the channel layer CL. The channel layer CL may include a semiconductor material. In an example, the channel layer CL may include poly-silicon.

The memory layer ML may include multi-layered insulating layers. The memory layer ML may include a tunnel layer surrounding the channel layer CL, a storage layer surrounding the tunnel layer, and a blocking layer surrounding the storage layer. The tunnel layer may include an insulating material through which charges can tunnel. In an example, the tunnel layer may include oxide. The storage layer may include a material in which charges can be trapped. In an example, the storage layer may include at least one of nitride, silicon, a phase change material, and nano dots. The blocking layer may include an insulating material capable of blocking movement of charges. In an example, the blocking layer may include oxide. A thickness of the tunnel layer may be thinner than that of the blocking layer.

Apart from the drawings, the channel structure CS, in an embodiment, may further include a filling layer in the channel layer CL. The filling layer may include an insulating material. In an example, the filling layer may include oxide.

A second stack structure STS2 may be provided on the first and second peripheral source structures PSS1 and PSS2 and the second peripheral transistor TR2. The second stack structure STS2 may include second insulating patterns IP2 and sacrificial patterns FP, which are alternately stacked in the third direction D3.

The second insulating patterns IP2 may include an insulating material. In an example, the second insulating patterns IP2 may include oxide. The sacrificial patterns FP may include an insulating material. In an example, the sacrificial patterns FP may include nitride.

A second insulating layer 120 may be provided, which covers the first stack structure STS1 and the second stack structure STS2. The second insulating layer 120 may include an insulating material. In an example, the second insulating layer 120 may include oxide.

Bit line contacts BCT connected to the channel structures CS may be provided. The bit line contact BCT may be connected to the channel layer CL of the channel structure CS. The bit line contacts BCT may extend in the third direction D3. The bit line contact BCT may include a conductive material. In an example, the bit line contacts BCT may include copper, aluminum, and tungsten.

Word line contacts WCT may be provided, which are connected to the conductive patterns CP of the first stack structure STS1. The word line contact WCT may be connected to a portion of the top surface of the conductive pattern CP defining the stepped structure STE. The word line contacts WCT may extend in the third direction D3. Lengths of the word line contacts WCT in the third direction D3 may be different from each other. The word line contacts WC may include a conductive material. In an example, the word line contact WCT may include copper, aluminum or tungsten.

Second contacts CT2 may be provided, which are connected to the second peripheral transistor TR2. The second contacts CT2 may penetrate the second insulating patterns IP2 and the sacrificial patterns FP of the second stack structure STS2. At least one of the second contacts CT2 may be connected to the second impurity region IR2 of the second peripheral transistor TR2. At least one of the second contacts CT2 may be connected to the second gate pattern GP2 of the second peripheral transistor TR2. The second contact CT2 connected to the second impurity region IR2 may penetrate the second gate spacer GA2 of the second peripheral transistor TR2.

The second contacts CT2 may extend in the third direction D3. A length of the second contact CT2 connected to the second impurity region IR2 in the third direction D3 and a length of the second contact CT2 connected to the second gate pattern GP2 in the third direction D3 may be different from each other. The second contacts CT2 may include a conductive material. In an example, the second contacts CT2 may include copper, aluminum or tungsten.

Bit lines BL connected to the bit line contacts BCT may be provided. In an example, the bit lines BL may extend in the second direction D2. In an example, the bit lines BL may be arranged in the first direction D1. The bit line BL may include a conductive material. In an example, the bit line BL may include copper, aluminum or tungsten.

Second lines ML2 connected to the word line contacts WCT may be provided. The second lines ML2 may include a conductive material. In an example, the second lines ML2 may include copper, aluminum or tungsten.

Third lines ML3 connected to the second contacts CT2 may be provided. The third lines ML3 may include a conductive material. In an example, the third lines ML3 may include copper, aluminum or tungsten.

The bit line BL may be electrically connected to the first line ML1 or the third line ML3. When the bit line BL is connected to the first line ML1, the channel structure CS may be electrically connected to the first peripheral transistor TR1 through the bit line contact BCT, the bit line BL, and the first contact CT1. When the bit line BL is connected to the third line ML3, the channel structure CS may be electrically connected to the second peripheral transistor TR2 through the bit line contact BCT, the bit line BL, the third line ML3, and the second contact CT2.

The second line ML2 may be electrically connected to the first line ML1 or the third line ML3. When the second line ML2 is connected to the first line ML1, the conductive pattern CP may be electrically connected to the first peripheral transistor TR1 through the word line contact WCT, the second line ML2, the first line ML1, and the first contact CT1. When the second line ML2 is connected to the third line ML3, the conductive pattern CP may be electrically connected to the second peripheral transistor TR2 through the word line contact WCT, the second line ML2, the third line ML3, and the second contact CT2.

In the semiconductor memory device in accordance with an embodiment, the second peripheral transistor TR2 disposed at the same level as the cell source structure CSS can be used as a peripheral transistor connected to the channel structure CS or the conductive pattern CP. Accordingly, a relatively large number of peripheral transistors can be arranged in a limited space, and the operational reliability of the semiconductor memory device can be improved.

FIGS. 2A to 2K are sectional views illustrating a manufacturing method of the semiconductor memory device in accordance with an embodiment of the present disclosure.

For convenience of description, components identical to those described with reference to FIGS. 1A and 1B are designated by like reference numerals, and overlapping descriptions will be omitted. A manufacturing method described below is an embodiment of the manufacturing method of the semiconductor memory device shown in FIGS. 1A and 1B, and the manufacturing method of the semiconductor memory device shown in FIGS. 1A and 1B is not limited to that described below.

Figure 2A:
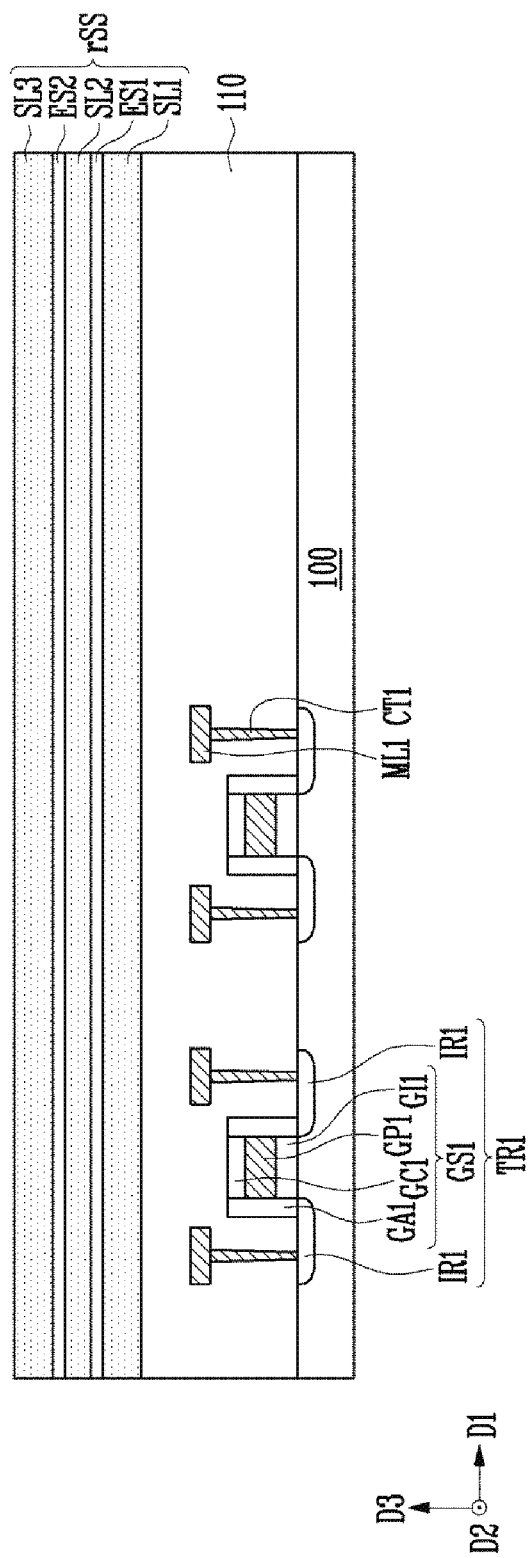

Referring to FIG. 2A, a first peripheral transistor TR1 and a first insulating layer 110 may be formed on a substrate 100. The first peripheral transistor TR1 may include a first gate structure GS1 and first impurity regions IR1. The first gate structure GS1 may include first gate spacers GA1, a first gate pattern GP1, a gate insulating layer GI1, and a first gate capping layer GC1. A first contact CT1 and a first line ML1 may be formed in the first insulating layer 110.

A preliminary source structure rSS may be formed on the first insulating layer 110. The preliminary source structure rSS may include a first source layer SL1, a first etch stop layer ES1, a second source layer SL2, a second etch stop layer ES2, and a third source layer SL3.

The first and second etch stop layers ES1 and ES2 may include an insulating material. In an example, the first and second etch stop layers ES1 and ES2 may include oxide or a high dielectric constant material. The first and third source layers SL1 and SL3 may include a conductive material. In an example, the first and third source layers SL1 and SL3 may include doped poly-silicon. The second source layer SL2 may include an insulating material. In an example, the second source layer SL2 may include doped poly-silicon or undoped poly-silicon.

Figure 2B:
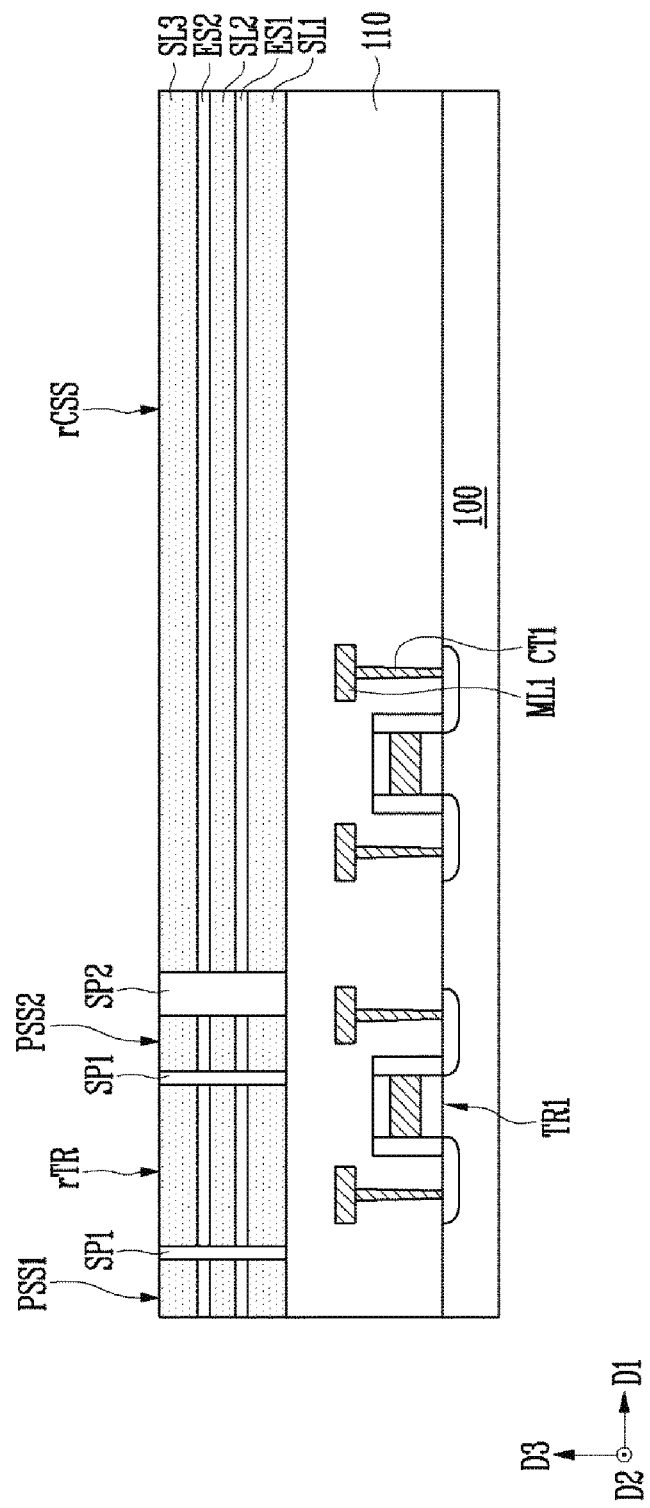

Referring to FIG. 2B, first spacers SP1 and a second spacer SP2 may be formed, which penetrate the preliminary source structure rSS. The preliminary source structure rSS may be separated by the first spacers SP1 and the second spacer SP2, so that first and second peripheral source structure PSS1 and PSS2, a preliminary cell source structure rCSS, and a preliminary transistor rTR are formed. The first and second spacers SP1 and SP2 may include an insulating material. In an example, the first and second spacers SP1 and SP2 may include oxide.

The process of forming the first spacers SP1 and the second spacer SP2 may include a process of forming trenches by patterning the preliminary source structure rSS and a process of forming an insulating material in the trenches. Through the patterning, the preliminary source structure rSS may be formed with the first and second peripheral source structures PSS1 and PSS2, the preliminary cell source structure rCSS, and the preliminary transistor rTR.

Each of the first and second peripheral source structures PSS1 and PSS2, the preliminary cell source structure rCSS, and the preliminary transistor rTR may include the first source layer SL1, the first etch stop layer ES1, the second source layer SL2, the second etch stop layer ES2, and the third source layer SL3.

The preliminary transistor rTR may be formed between the first spacers SP1. The preliminary transistor rTR may be formed between the first and second peripheral source structures PSS1 and PSS2. The preliminary cell source structure rCSS may be spaced apart from the second peripheral source structure PSS2 by the second spacer SP2.

Figure 2C:
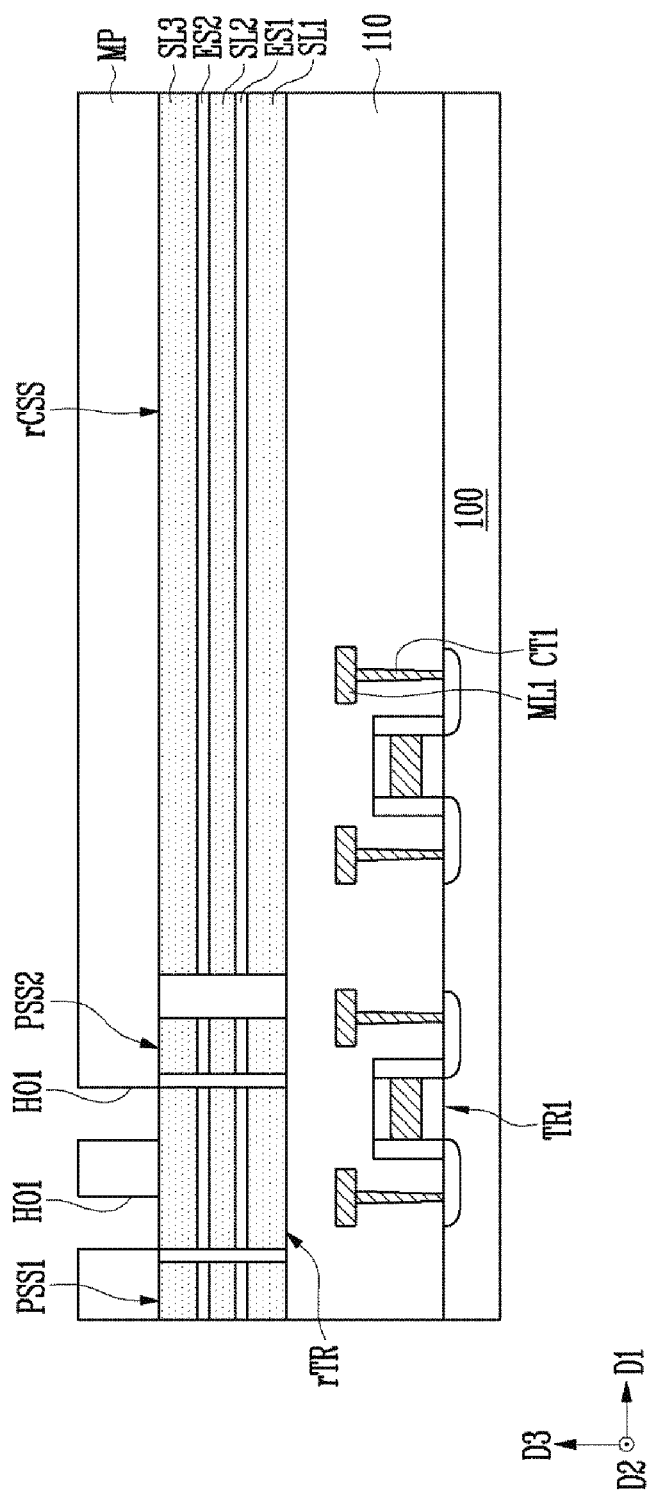

Referring to FIG. 2C, a mask pattern MP may be formed on the preliminary cell source structure rCSS, the first and second peripheral source structures PSS1 and PSS2, and the preliminary transistor rTR. The mask pattern MP may include first holes HO1.

The process of forming the mask pattern MP may include a process of forming a mask layer on the preliminary cell source structure rCSS, the first and second peripheral source structures PSS1 and PSS2, and the preliminary transistor rTR and a process of forming the first holes HO1 by patterning the mask layer.

A portion of a top surface of the preliminary transistor rTR may be exposed by the first holes HO1.

Figure 2D:
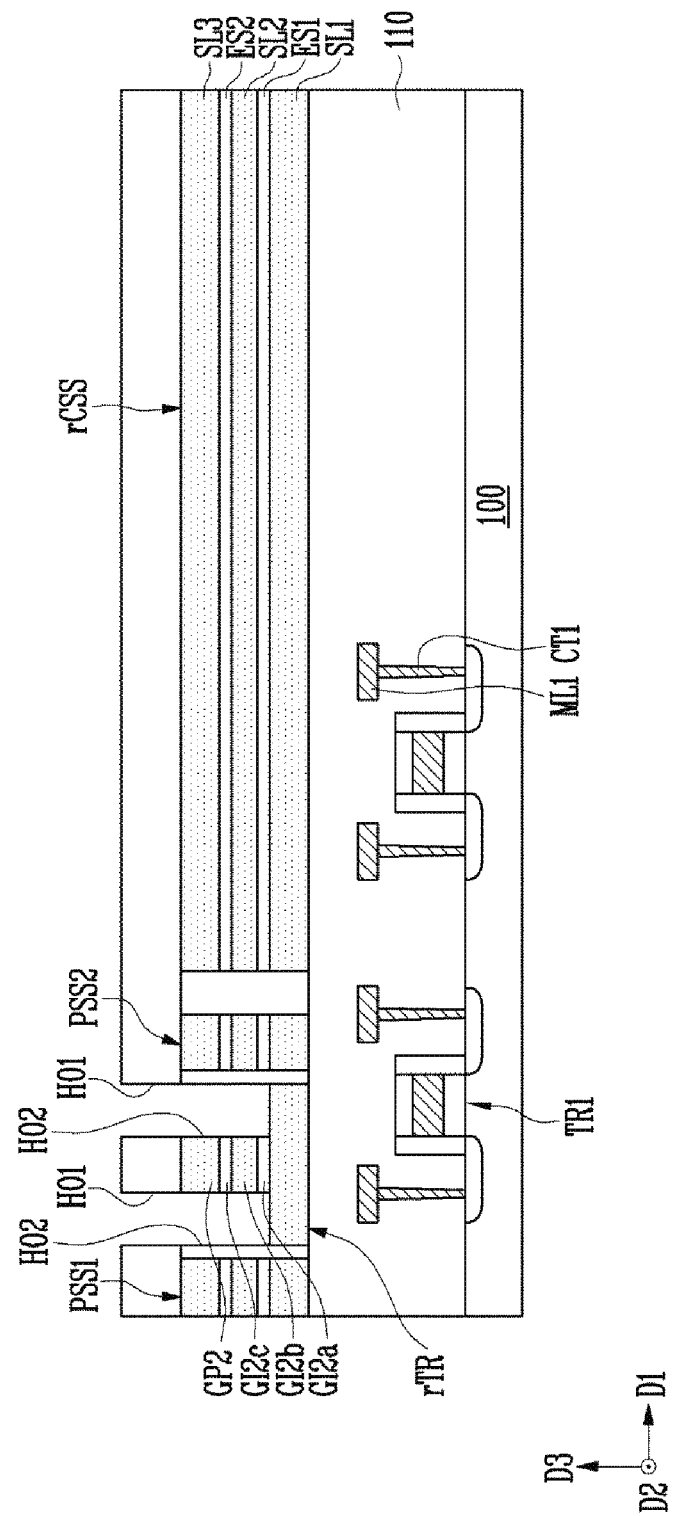

Referring to FIG. 2D, the preliminary transistor rTR may be patterned using the mask pattern MP as an etching mask. When the preliminary transistor rTR is patterned, second holes HO2 may be formed.

The first and second etch stop layers ES1 and ES2 and the second and third source layers SL2 and SL3 of the preliminary transistor rTR may be patterned. The first etch stop layer ES1 of the preliminary transistor rTR may be patterned, so that a first interposition part GI2a is formed. The second source layer SL2 of the preliminary transistor rTR may be patterned, so that a second interposition part GI2b is formed. The second etch stop layer ES2 of the preliminary transistor rTR may be patterned, so that a third interposition part GI2c is formed. The third source layer SL3 of the preliminary transistor rTR may be patterned, so that a second gate pattern GP2 is formed.

The first to third interposition parts GI2a, GI2b, and GI2c and the second gate pattern GP2 may be disposed between the second holes HO2. A portion of a top surface of the first source layer SL1 of the preliminary transistor rTR may be exposed by the second holes HO2.

Referring to FIG. 2E, second impurity regions IR2 may be formed in the first source layer SL1 of the preliminary transistor rTR. The process of forming the second impurity regions IR2 may include a process of doping an impurity into the first source layer SL1 of the preliminary transistor rTR through the second holes HO2.

In the first source layer SL1 of the preliminary transistor rTR, portions doped with the impurity may be defined as the second impurity regions IR2. In the first source layer SL1 of the preliminary transistor rTR, a portion undoped with the impurity may be defined as a base part BA.

A level of bottom surfaces of the second impurity regions IR2 may be higher than that of a bottom surface of the preliminary cell source structure rCSS. A level of top surfaces of the second impurity regions IR2 may be lower than that of a top surface of the preliminary cell source structure rCSS.

Figure 2F:
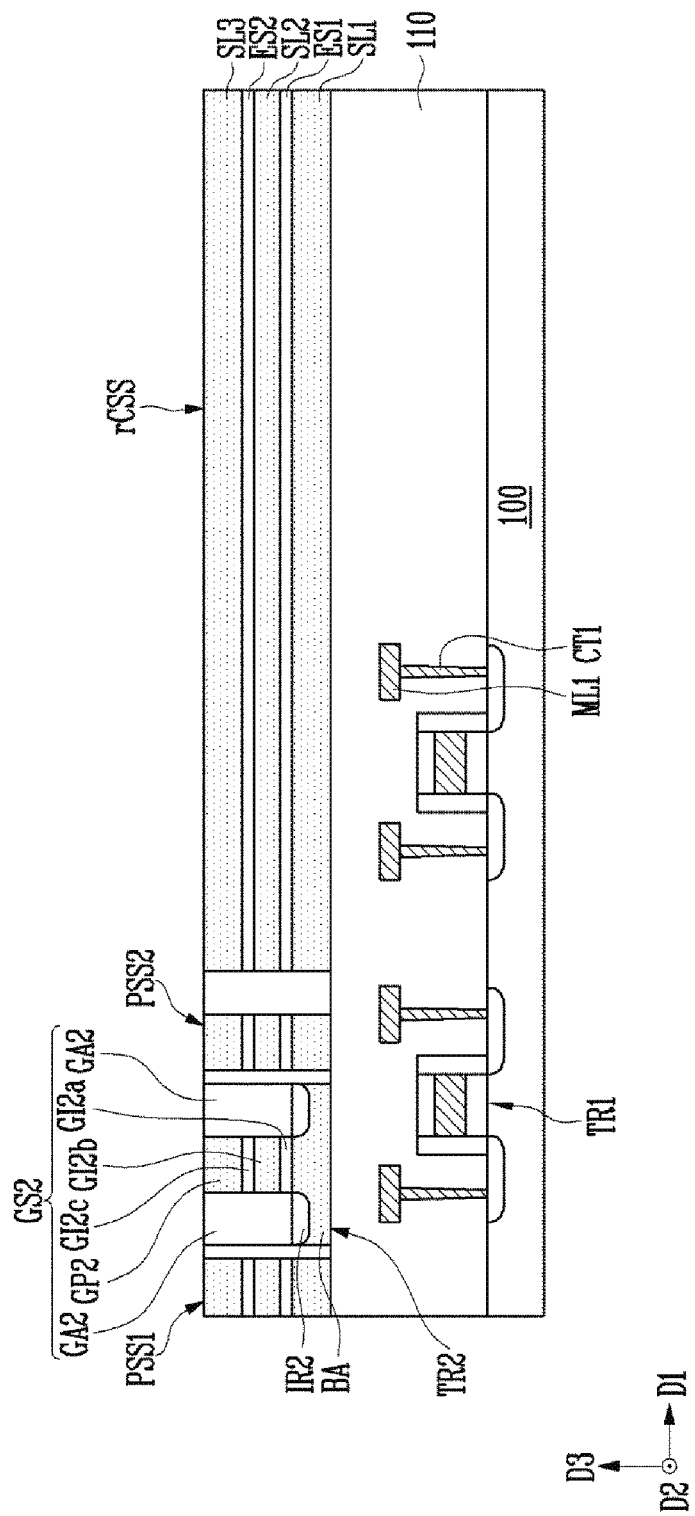

Referring to FIG. 2F, second gate spacers GA2 may be formed in the second holes HO2. The second gate spacers GA2 may include an insulating material. In an example, the second gate spacers GA2 may include oxide.

When the second gate spacers GA2 are formed, a second peripheral transistor TR2 may be defined. The second peripheral transistor TR2 may include a second gate structure GS2, the second impurity regions IR2, and the base part BA. The second gate structure GS2 may include the first to third interposition parts GI2a, GI2b, and GI2c, the second gate pattern GP2, and the second gate spacers GA2.

After the second gate spacers GA2 are formed, the mask pattern MP may be removed.

Figure 2G:
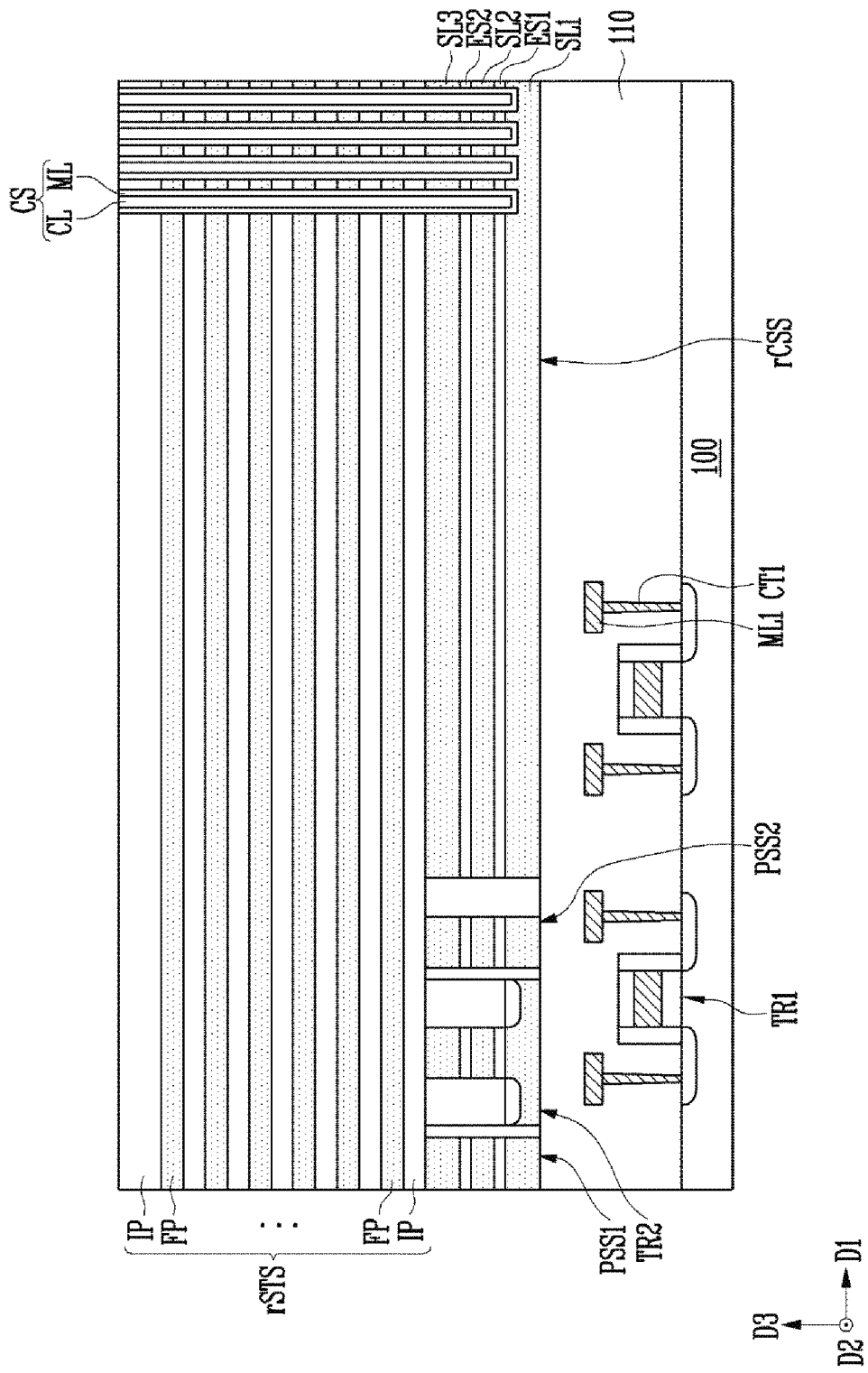

Referring to FIG. 2G, a preliminary stack structure rSTS may be formed on the preliminary cell source structure rCSS, the first and second peripheral source structures PSS1 and PSS2 and the second transistor TR2. The preliminary stack structure rSTS may include insulating patterns IP and sacrificial patterns FP, which are alternately stacked in a third direction D3. In an example, the insulating patterns IP may include oxide. In an example, the sacrificial patterns FP may include nitride.

After the preliminary stack structure rSTS is formed, channel structures CS may be formed. The channel structures CS may penetrate the preliminary stack structure rSTS. The channel structures CS may include a channel layer CL penetrating the preliminary stack structure rSTS and a memory layer ML surrounding the channel layer CL.

Figure 2H:
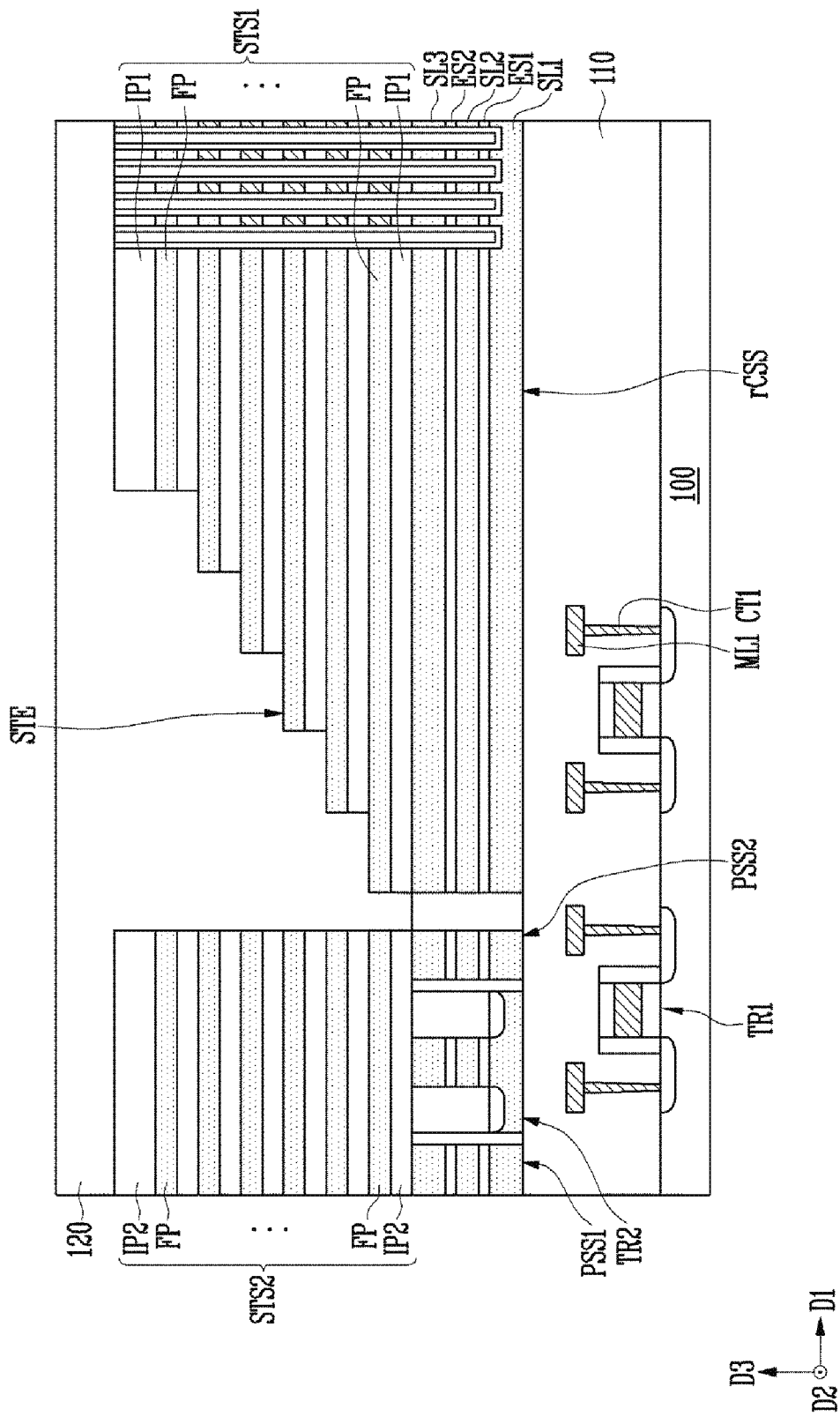

Referring to FIG. 2H, a process of patterning the preliminary stack structure rSTS may be performed. When the process of patterning the preliminary stack structure rSTS is performed, the preliminary stack structure rSTS may be separated into a first stack structure STS1 and a second stack structure STS2. The insulating patterns IP of the preliminary stack structure rSTS may be separated into first insulating patterns IP1 and second insulating patterns IP2. The first stack structure STS1 may be disposed on the preliminary cell source structure rCSS. The second stack structure STS2 may be disposed on the first and second peripheral source structures PSS1 and PSS2 and the second peripheral transistor TR2. The first stack structure STS1 may include a stepped structure STE.

After the process of patterning the preliminary stack structure rSTS is performed, a second insulating layer 120 may be formed, which covers the first stack structure STS1 and the second stack structure STS2.

Figure 2I:
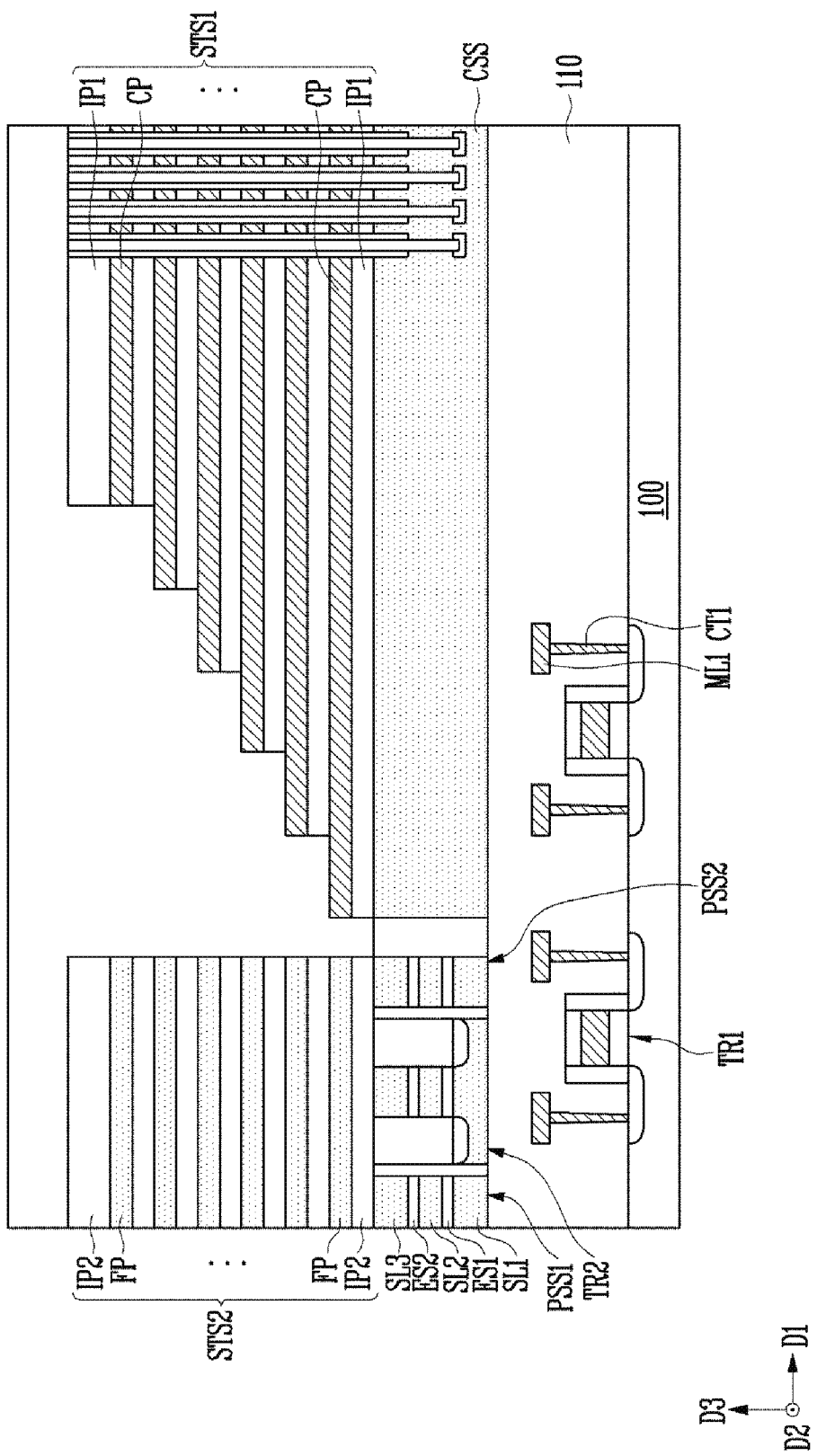

Referring to FIG. 2I, a cell source structure CSS may be formed. The process of forming the cell source structure CSS may include a process of forming an empty space by removing at least a portion of the preliminary cell source structure rCSS and a process of forming a source material layer in the empty space. In an example, the at least a portion of the preliminary cell source structure rCSS may correspond to the first and second etch stop layers ES1 and ES2 and the second source layer of the preliminary cell source structure rCSS. The source material layer may include a conductive material. In an example, the source material layer may include doped poly-silicon.

The sacrificial patterns FP of the first stack structure STS1 may be replaced with conductive patterns CP. The process of replacing the sacrificial patterns FP of the first stack structure STS1 with conductive patterns CP may include a process of forming an empty space by removing the sacrificial patterns FP of the first stack structure STS1 and a process of forming the conductive patterns CP in the empty space.

Figure 2J:
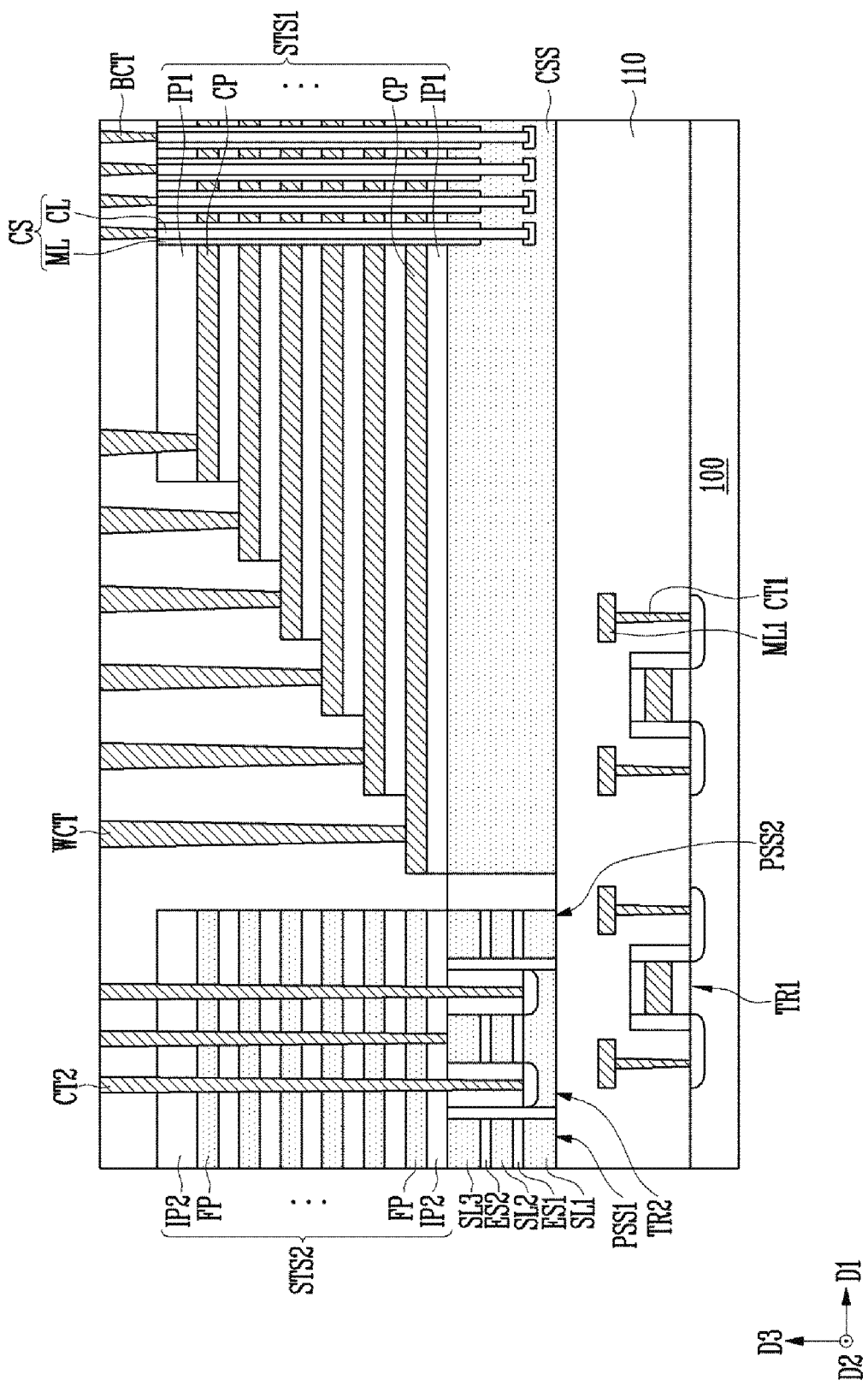

Referring to FIG. 2J, there may be formed bit line contacts BCT connected to the channel structure CS, word line contacts WCT connected to the conductive patterns CP, and second contacts CT2 connected to the second peripheral transistor TR2.

Figure 2K:
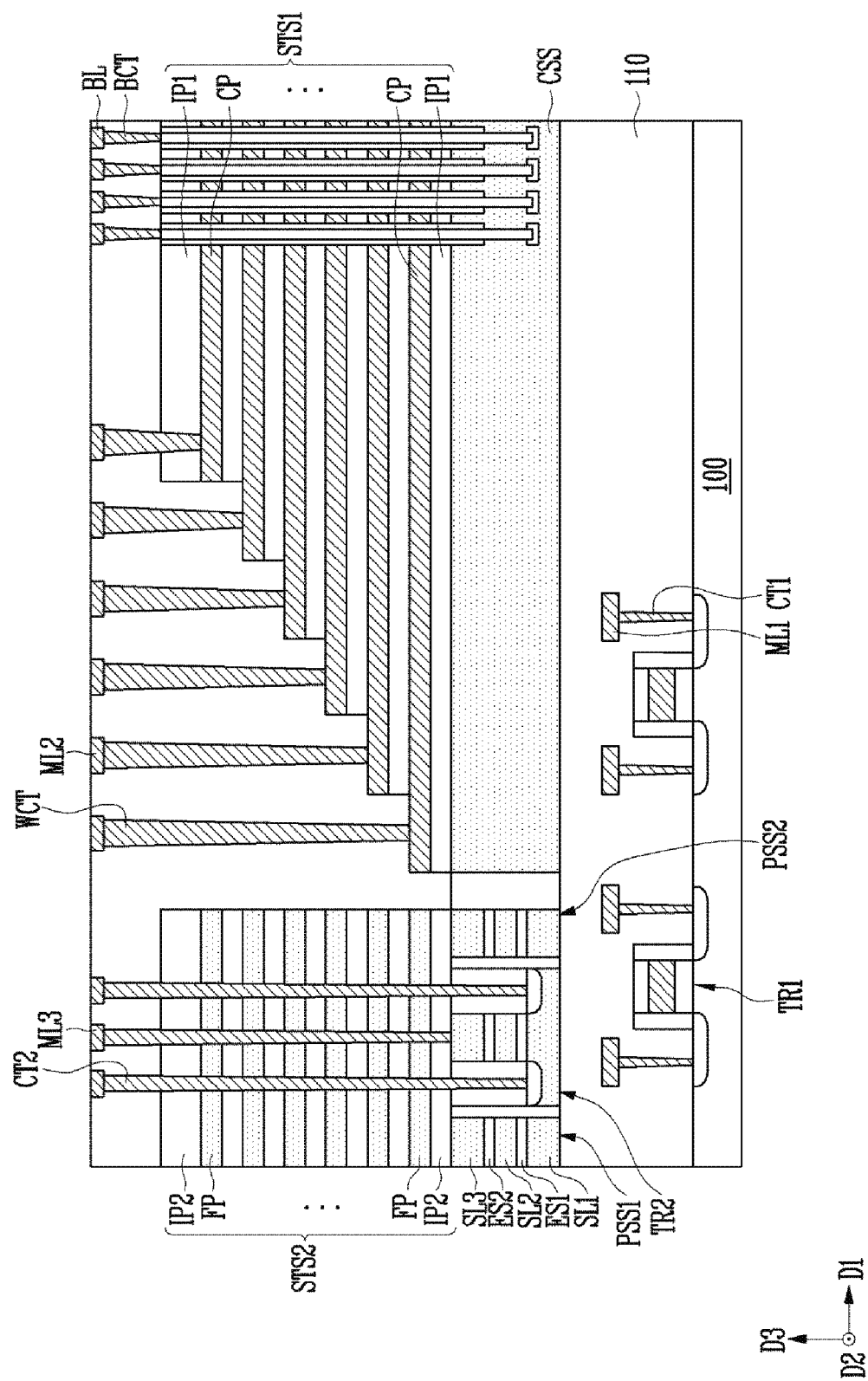

Referring to FIG. 2K, there may be formed bit lines connected to the bit line contact BCT, second lines ML2 connected to the word line contacts WCT, and third lines ML3 connected to the second contacts CT2.

In the manufacturing method in accordance with these embodiments, a portion of the preliminary source structure rSS can be formed as the second peripheral transistor TR2. Accordingly, a relatively large number of peripheral transistors can be disposed in a limited space, and the operational reliability of the semiconductor memory device can be improved.

Figure 3:
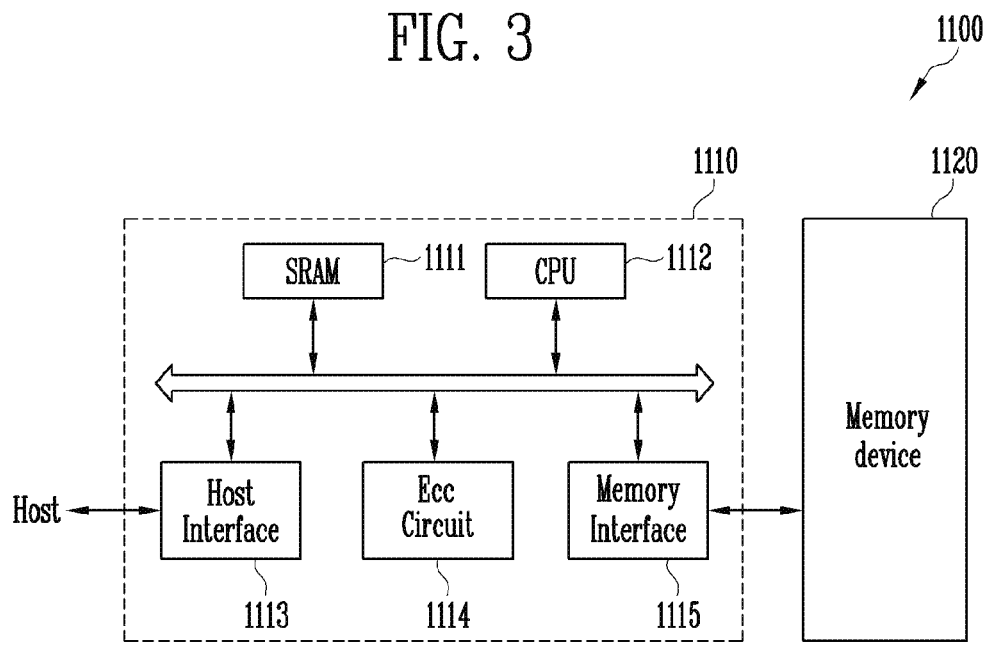
FIG. 3 is a block diagram illustrating a configuration of a memory system in accordance with an embodiment of the present disclosure.

FIG. 3 is a block diagram illustrating a configuration of a memory system in accordance with an embodiment of the present disclosure.

Referring to FIG. 3, the memory system 1100 in accordance with the embodiment of the present disclosure includes a memory device 1120 and a memory controller 1110.

The memory device 1120 may include the structures described with reference to FIGS. 1A and 1B. The memory device 1120 may be a multi-chip package configured with a plurality of flash memory chips.

The memory controller 1110 is configured to control the memory device 1120, and may include a Static Random Access Memory (SRAM) 1111, a Central Processing Unit (CPU) 1112, a host interface 1113, an Error Correction Code (ECC) circuit 1114, and a memory interface 1115. The SRAM 1111 is used as an operation memory of the CPU 1112, the CPU 1112 performs overall control operations for data exchange of the memory controller 1110, and the host interface 1113 includes a data exchange protocol for a host connected with the memory system 1100. The ECC circuit 1114 detects and corrects an error included in a data read from the memory device 1120, and the memory interface 1115 interfaces with the memory device 1120. In addition, the memory controller 1110 may further include an ROM for storing code data for interfacing with the host, and the like.

The memory system 1100 configured as described above may be a memory card or a Solid State Disk (SSD), in which the memory device 1120 is combined with the controller 1110. For example, when the memory system 1100 is an SSD, the memory controller 1100 may communicated with the outside (e.g., the host) through one among various interface protocols, such as a Universal Serial Bus (USB) protocol, a Multi-Media Card (MMC) protocol, a Peripheral Component Interconnection (PCI) protocol, a PCI-Express (PCI-E) protocol, an Advanced Technology Attachment (ATA) protocol, a Serial-ATA (SATA) protocol, a Parallel-ATA (PATA) protocol, a Small Computer Small Interface (SCSI) protocol, an Enhanced Small Disk Interface (ESDI) protocol, and an Integrated Drive Electronics (IDE) protocol.

Figure 4:
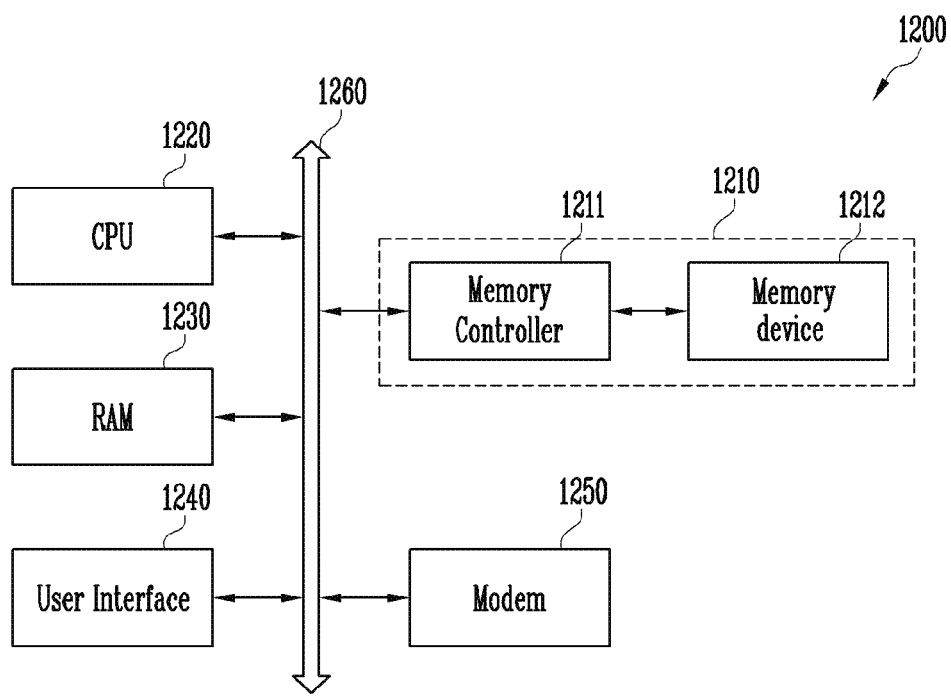
FIG. 4 is a block diagram illustrating a configuration of a computing system in accordance with an embodiment of the present disclosure.

FIG. 4 is a block diagram illustrating a configuration of a computing system in accordance with an embodiment of the present disclosure.

Referring to FIG. 4, the computing system 1200 in accordance with the embodiments of the present disclosure may include a CPU 1220, a random access memory (RAM) 1230, a user interface 1240, a modem 1250, and a memory system 1210, which are electrically connected to a system bus 1260. When the computing system 1200 is a mobile device, a battery for supplying an operation voltage to the computing system 1200 may be further included, and an application chip set, a Camera Image Processor (CIS), a mobile D-RAM, and the like may be further included.

The memory system 1200 may be configured with a memory device 1212 and a memory controller 1211 as described with reference to FIG. 3.

In the semiconductor memory device in accordance with the present disclosure, a peripheral transistor can be disposed at the same level as the cell source structure. Accordingly, a relatively large number of peripheral transistors can be disposed in a limited space, and the operational reliability of the semiconductor memory device can be improved.

While the present disclosure has been shown and described with reference to certain examples of embodiments thereof, it will be understood by those skilled in the art that various changes in form and details may be made therein without departing from the spirit and scope of the present disclosure as defined by the appended claims and their equivalents. Therefore, the scope of the present disclosure should not be limited to the above-described examples of embodiments but should be determined by not only the appended claims but also the equivalents thereof.

In the above-described embodiments, all steps may be selectively performed or part of the steps and may be omitted. In each embodiment, the steps are not necessarily performed in accordance with the described order and may be rearranged. The embodiments disclosed in this specification and drawings are only examples to facilitate an understanding of the present disclosure, and the present disclosure is not limited thereto. That is, it should be apparent to those skilled in the art that various modifications can be made on the basis of the technological scope of the present disclosure.

Meanwhile, the examples of embodiments of the present disclosure have been described in the drawings and specification. Although specific terminologies are used here, those are only to explain the embodiments of the present disclosure. Therefore, the present disclosure is not restricted to the above-described embodiments and many variations are possible within the spirit and scope of the present disclosure. It should be apparent to those skilled in the art that various modifications can be made on the basis of the technological scope of the present disclosure in addition to the embodiments disclosed herein.

What is claimed is:
1. A semiconductor memory device comprising:
   a cell source structure;
   a first stack structure disposed on the cell source structure, the first stack structure including insulating patterns and conductive patterns, which are alternately stacked;
   a channel structure penetrating the first stack structure, the channel structure being connected to the cell source structure; and
   a first peripheral transistor including impurity regions and a gate structure,
   wherein a level of a bottom surface of each of the impurity regions is higher than that of a bottom surface of the cell source structure, and
   a level of a top surface of each of the impurity regions is lower than that of a top surface of the cell source structure, wherein a level of a top surface of the gate structure is equal to that of the top surface of the cell source structure.

2. The semiconductor memory device of claim 1, wherein the first peripheral transistor further includes a base part including a channel region,
wherein the impurity regions are located at both sides of an upper portion of the base part,
wherein the channel region is located between the impurity regions,
wherein a level of a bottom surface of the base part is substantially equal to that of the bottom surface of the cell source structure.

3. The semiconductor memory device of claim 1, wherein the first peripheral transistor further includes a base part including a channel region,
wherein the base part includes the same material as the cell source structure.

4. The semiconductor memory device of claim 3, wherein the base part and the cell source structure include doped poly-silicon.

5. The semiconductor memory device of claim 1, wherein the gate structure includes:
gate spacers;
a gate pattern between the gate spacers; and
a gate interposition layer between the gate spacers.

6. The semiconductor memory device of claim 5, wherein the gate pattern includes the same material as the cell source structure.

7. The semiconductor memory device of claim 6, wherein the gate pattern and the cell source structure include doped poly-silicon.

8. The semiconductor memory device of claim 5, wherein the gate interposition layer includes a first interposition part, a second interposition part, and a third interposition part, which are sequentially stacked,
wherein the second interposition part includes doped poly-silicon or undoped poly-silicon.

9. The semiconductor memory device of claim 8, wherein the first and third interposition parts include a same material and the second interposition part includes a material different from that of the first and third interposition parts.

10. The semiconductor memory device of claim 5, further comprising first contacts connected to the first peripheral transistor,
wherein at least one of the first contacts penetrates the gate spaces and is connected to at least one of the impurity regions.

11. A semiconductor memory device, comprising:
a first peripheral transistor;
a first insulating layer covering the first peripheral transistor;
a cell source structure on the first insulating layer;
a first stack structure disposed on the cell source structure, the first stack structure including first insulating patterns and conductive patterns, which are alternately stacked;
a channel structure penetrating the first stack structure, the channel structure being connected to the cell source structure; and
a second peripheral transistor on the first insulating layer,
wherein the first peripheral transistor is disposed at a level lower than that of the cell source structure, and
the second peripheral transistor is disposed at the same level as the cell source structure.

12. The semiconductor memory device of claim 11, wherein the first peripheral transistor and the second peripheral transistor overlap with each other.

13. The semiconductor memory device of claim 11, further comprising a second stack structure disposed on the second peripheral transistor, the second stack structure including second insulating patterns and sacrificial patterns, which are alternately stacked.

14. The semiconductor memory device of claim 13, further comprising first contacts connected to the second peripheral transistor,
wherein the first contacts penetrate the second stack structure.

15. The semiconductor memory device of claim 11, wherein the second peripheral transistor includes an impurity region,
wherein a level of a bottom surface of the impurity region is higher than that of a bottom surface of the cell source structure, and
a level of a top surface of the impurity region is lower than that of a top surface of the cell source structure.

16. The semiconductor memory device of claim 11, further comprising a peripheral source structure between the second peripheral transistor and the cell source structure.

17. The semiconductor memory device of claim 16, further comprising a first spacer disposed between the second peripheral transistor and the peripheral source structure and a second spacer disposed between the peripheral source structure and the cell source structure.

18. The semiconductor memory device of claim 16, wherein the peripheral source structure includes a first source layer, a second source layer, and a third source layer between the first and second source layers,
wherein the first and second source layers include the same material as the cell source structure.

* * * * *